United States Patent
Chan et al.

(10) Patent No.: US 10,667,399 B1
(45) Date of Patent: May 26, 2020

(54) DISCRETE COMPONENT CARRIER

(71) Applicant: NOKIA SOLUTIONS AND NETWORKS OY, Espoo (FI)

(72) Inventors: Alex Chan, Ottawa (CA); Paul Brown, Wakefield (CA)

(73) Assignee: NOKIA SOLUTIONS AND NETWORKS OY, Espoo (FI)

( * ) Notice: Subject to any disclaimer, the term of this patent is extended or adjusted under 35 U.S.C. 154(b) by 0 days.

(21) Appl. No.: 16/201,362

(22) Filed: Nov. 27, 2018

(51) Int. Cl.
| | |
|---|---|
| *H05K 1/00* | (2006.01) |
| *H05K 1/11* | (2006.01) |
| *H05K 1/18* | (2006.01) |
| *H01L 21/02* | (2006.01) |
| *H01L 21/56* | (2006.01) |
| *H01L 23/02* | (2006.01) |
| *H01L 23/48* | (2006.01) |
| *H01L 23/66* | (2006.01) |
| *H01L 23/367* | (2006.01) |
| *H01L 23/495* | (2006.01) |
| *H01L 23/538* | (2006.01) |
| *H01L 23/552* | (2006.01) |
| *H05K 1/14* | (2006.01) |

(52) U.S. Cl.
CPC .......... *H05K 1/183* (2013.01); *H05K 1/11* (2013.01); *H05K 1/115* (2013.01); *H05K 1/144* (2013.01); *H05K 2201/041* (2013.01); *H05K 2201/09036* (2013.01); *H05K 2201/09745* (2013.01)

(58) Field of Classification Search
CPC ... H05K 1/00; H05K 1/11; H05K 1/18; H01L 21/02; H01L 21/56; H01L 23/02; H01L 23/48; H01L 23/66; H01L 23/367; H01L 23/495; H01L 23/538; H01L 23/552
USPC .......... 174/255, 258; 257/81, 698, 738, 777, 257/780
See application file for complete search history.

(56) References Cited

U.S. PATENT DOCUMENTS

| | | | |
|---|---|---|---|
| 9,059,160 B1* | 6/2015 | Sutardja | H01L 23/49894 |
| 10,163,798 B1* | 12/2018 | Alur | H01L 23/3128 |
| 2003/0116866 A1* | 6/2003 | Cher 'Khng | H01L 21/4853 257/780 |
| 2003/0209808 A1* | 11/2003 | Baba | H01L 21/563 257/777 |
| 2004/0069998 A1* | 4/2004 | Harazono | H01L 27/14618 257/81 |
| 2004/0238857 A1* | 12/2004 | Beroz | H01F 17/0033 257/232 |
| 2005/0104211 A1* | 5/2005 | Baba | H01L 21/563 257/738 |
| 2007/0145561 A1* | 6/2007 | Tsai | H01L 23/3121 257/685 |
| 2008/0079138 A1* | 4/2008 | Takahashi | H01L 23/13 257/698 |
| 2009/0184166 A1* | 7/2009 | Bhandarkar | G06K 19/07718 235/492 |

(Continued)

*Primary Examiner* — Xiaoliang Chen
(74) *Attorney, Agent, or Firm* — Kramer Amado, P.C.

(57) ABSTRACT

A printed circuit board (PCB) carrier including a multi-layer structure including a plurality of conductive layers and a plurality of insulating layers respectively spaced between the plurality of conductive layers, the multi-layer structure having a footprint corresponding to a large size component of the PCB, and a pocket formed in the multi-layer structure, the pocket configured to receive a discrete component of a size smaller than the large size component.

15 Claims, 3 Drawing Sheets

(56) References Cited

U.S. PATENT DOCUMENTS

| | | | |
|---|---|---|---|
| 2010/0065961 A1* | 3/2010 | Elian | H01L 21/565 |
| | | | 257/698 |
| 2010/0207217 A1* | 8/2010 | Zuniga-Ortiz | B81C 1/0023 |
| | | | 257/415 |
| 2010/0230148 A1* | 9/2010 | Kariya | H01L 23/13 |
| | | | 174/258 |
| 2014/0102772 A1* | 4/2014 | Chen | H05K 1/113 |
| | | | 174/255 |
| 2015/0115303 A1* | 4/2015 | Pachler | H01L 33/60 |
| | | | 257/98 |
| 2015/0232325 A1* | 8/2015 | Chou | B81B 7/0061 |
| | | | 257/416 |
| 2016/0211190 A1* | 7/2016 | Braunisch | H01L 21/52 |
| 2016/0240481 A1* | 8/2016 | Chen | H01L 23/5389 |
| 2017/0018505 A1* | 1/2017 | Lin | H01L 23/5389 |
| 2017/0231094 A1* | 8/2017 | Blackshear | H05K 1/0298 |
| 2018/0315721 A1* | 11/2018 | Sato | H01L 23/04 |
| 2018/0358302 A1* | 12/2018 | Tuominen | H01L 23/3107 |
| 2019/0043797 A1* | 2/2019 | Tan | H01L 23/04 |

* cited by examiner

DISCRETE COMPONENT CARRIER

TECHNICAL FIELD

Embodiments disclosed herein relate generally to a package for a semiconductor substrate, and more particularly to a printed circuit board (PCB) carrier that may be used to hold small discrete devices.

SUMMARY

A brief summary of various embodiments is presented below. Some simplifications and omissions may be made in the following summary, which is intended to highlight and introduce some aspects of the various embodiments, but not to limit the scope of the invention. Detailed descriptions of embodiments adequate to allow those of ordinary skill in the art to make and use the inventive concepts will follow in later sections.

A discrete component carrier including a multi-layer structure including a plurality of conductive layers and a plurality of insulating layers respectively spaced between the plurality of conductive layers, the multi-layer structure having a footprint corresponding to a large size component of a printed circuit board (PCB), and a pocket formed in the multi-layer structure, the pocket configured to receive a discrete component of a size smaller than the large size component.

The multi-layer structure may include a lower conductive layer, an intermediate conductive layer, and a top conductive layer.

The intermediate conductive layer may include a thin portion proximate the pocket and a thick portion distal from the pocket. The intermediate layer may include a landing portion configured to receive and make electrical connection with the discrete component.

The discrete component carrier may include a plurality of insulation layers of different widths to form the pocket.

The lower conductive layer may include two portions with an air gap therebetween.

The intermediate conductive layer may include two portions with an air gap therebetween.

The discrete component carrier may include solder disposed within the pocket adjacent the top conductive layer to form an electrical connection with the discrete component.

Embodiments may also include a printed circuit board (PCB) carrier including a first conductive layer configured to be mounted on a PCB, the first conductive layer having a first gap of a first width, a first insulating layer disposed on the first conductive layer, the first insulating layer having the first gap of the first width, a second conductive layer disposed on the first insulating layer, the second conductive layer having a landing portion associated therewith and the first gap of the first width, a second insulating layer disposed on the second insulating layer, the second insulating layer having a pocket of a second width, and a top conductive layer disposed on the second insulation layer, the third conductive layer having the pocket of the second width configured to receive a discrete component, wherein the second width is greater than the first width.

The pocket may have a depth from the top conductive layer to the intermediate conductive layer.

The PCB carrier may include a conductive via configured to connect the lower conductive layer, intermediate conductive layer, and top conductive layer.

The PCB carrier may include solder disposed within the pocket adjacent the top conductive layer to form an electrical connection with the discrete component.

The first conductive layer may include two portions with an air gap therebetween, the air gap being narrower than the pocket of the second width.

The intermediate conductive layer includes two portions with an air gap therebetween, the air gap being narrower than the pocket of the second width.

The lower conductive layer is configured to have a footprint of a large size component that corresponds to a placement space on the PCB.

BRIEF DESCRIPTION OF THE DRAWINGS

Additional objects and features of the invention will be more readily apparent from the following detailed description and appended claims when taken in conjunction with the drawings. Although several embodiments are illustrated and described, like reference numerals identify like parts in each of the figures, in which:

DETAILED DESCRIPTION

Figure 1:
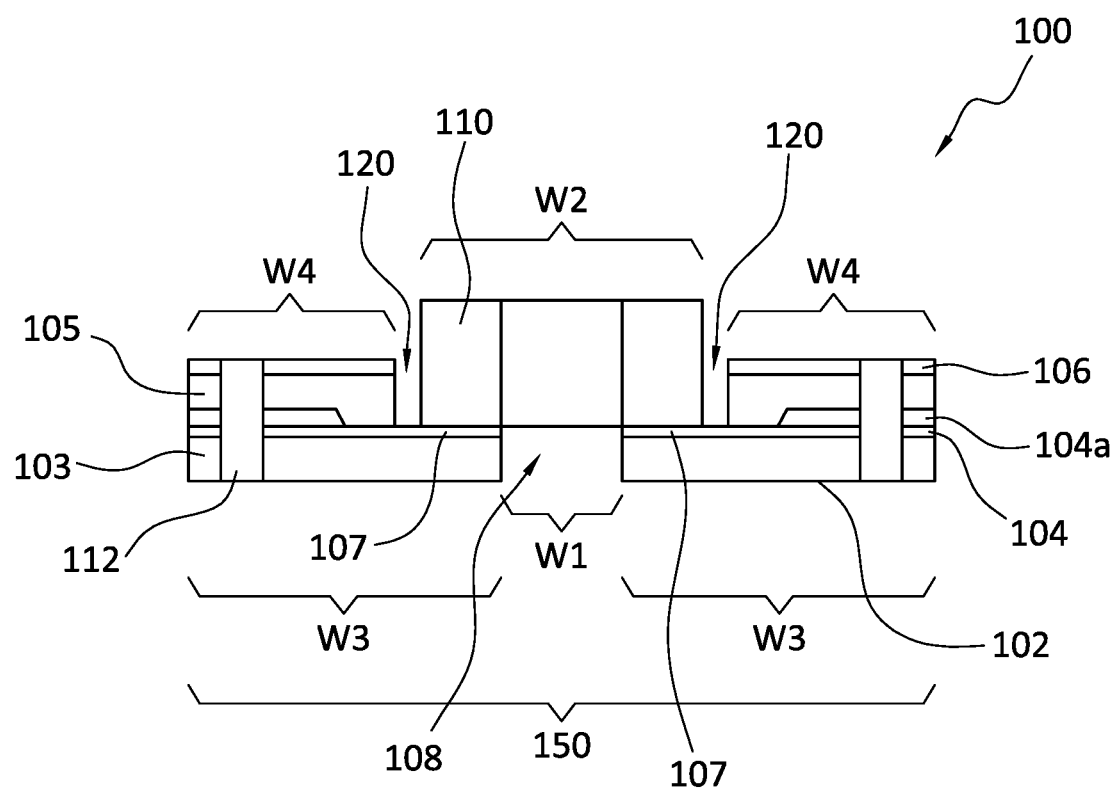
FIG. 1 illustrates a stacked PCB carrier configured to receive a discrete component in accordance with embodiments described herein.

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments. Descriptors such as "first," "second," "third," etc., are not meant to limit the order of elements discussed, are used to distinguish one element from the next, and are generally interchangeable. Values such as maximum or minimum may be predetermined and set to different values based on the application.

Small to miniature surface mount components (resistors and capacitors) are present in almost every electronic product from mobile phones to large networking equipment. These components are characterized by a dimension code of the form "XXYY" or "XXYYY" where the "XX" portion represents the length and "YYY" represents the width in hundredths of an inch. Thus, components may be labeled 0805, 0603, 0402, 0201, 01005 for identification and printed circuit board (PCB) design purposes. As is known to those skilled in the art, there is constant demand for either reduction of size in mobile equipment or need for PCB real-estate to progressively push a volume usage of particular component sizes to the smaller end of the size spectrum. Manufacturers constantly reconfigure their production lines to meet a higher demand for smaller components, resulting in a choking-off of supply of the larger sizes. This is a present and growing problem across company product lines.

Different scenarios arise during design, testing, and production phases of integrated circuits. Situations such as design error and design refinement may result in a change in a size of a discrete component to be used on a specific design location on a PCB. A substitute or replacement discrete component may be used to allow the shipment of a product in a schedule satisfying manner.

Embodiments described herein include an apparatus and method that allow a smaller size discrete component to be placed on a footprint of a larger sized component without re-design, modification, or alteration of a PCB.

PCBs may be configured to receive integrated circuits and components of varying sizes. PCBs may accept components that are mounted in various ways such as surface mount and solder mount.

PCBs may be designed for a product line, with all components having a designated place on a PCB. Different sizes of PCBs may exist. Different PCBs may include designs for different carriers to accept integrated circuit components of different sizes. A miniaturized PCB-type of carrier as described herein may be used to carry a small size discrete component that would normally be considered to be too small to place in the designated space. Embodiments may allow smaller components to be used due to various reasons that arise such as component shortages, design mistakes, etc.

Embodiments described herein include a miniaturized PCB-type of carrier with a pocket or indentation in the middle of the carrier. The pocket or indentation may receive a discrete component, partially surround the discrete component on a bottom and lower sides thereof, and leave an upper side of the discrete component open. The carrier with pocket may be used to carry a smaller size discrete component that would normally be considered to be too small to place in the designed space. Discrete components may include two terminal devices such as resistors, capacitors, inductors, diodes, thyristors, or the like.

FIG. 1 illustrates a stacked PCB carrier 100 configured to receive a discrete component 110 in accordance with embodiments described herein. The stacked PCB carrier 100 includes a pocket 120 formed therein. Both the inside (adjacent the pocket 120) and the outside of the stacked PCB carrier 100 are plated with a plurality of conductive layers configured to allow connection of a discrete component 110 mounted therein, and to other devices on a PCB. After the discrete component 110 has been mounted in the pocket 120 of the stacked PCB carrier 100, the stacked PCB carrier 100 with attached discrete component 110 may be attached to a PCB (illustrated in FIG. 3) using solder or other electrically adhesive material.

The stacked PCB carrier 100 may include a plurality of layers. The stacked PCB carrier 100 may be termed a multi-layer structure or multi-layer carrier. The stacked PCB carrier 100 may include a plurality of conductive layers and a plurality of insulating layers respectively spaced therebetween. As illustrated in FIG. 1, the stacked PCB carrier 100 may include three metal or conductive layers 102, 104, and 106 separated by insulating layers, but embodiments are not limited thereto. The stacked PCB carrier 100 may include a single metal layer or more than three layers, bearing in mind to connect the discrete component to a metal layer that may be connected to a PCB.

The stacked PCB carrier 100 may include a lower conductive layer 102. The lower conductive layer 102 may be a bottommost layer adjacent a PCB (illustrated in FIG. 3). The lower conductive layer 102 may be separated in two parts an across an air gap 108. The air gap 108 may have a first width W1. The air gap 108 may provide separation between opposing conductive portions of the stacked PCB carrier 100, solder (illustrated in FIG. 3), and opposing terminals of the discrete component 110. Opposing segments of the lower conductive layer 102 may have widths W3. Above the lower conductive layer 102 may be a first insulation layer 103. The insulation layer may have opposing segments that surround the air gap 108 and have widths that correspond to the width W3 of the lower conductive layer 102.

Above the first insulation layer 103 may be an intermediate conductive layer 104. The intermediate conductive layer 104 may include a landing portion 107 proximate the pocket 120 on which the discrete component 110 rests to make direct electrical contact with the stacked PCB carrier 100. The intermediate conductive layer 104 including the landing portion 107 may have dual portions that share the same width W3 as first insulation layer 103 and the lower conductive layer 102. The conductive landing portion 107 may be separated in two parts across the air gap 108. The intermediate conductive layer 104 may include an additional conductive layer 104a connected thereto. The additional conductive layer 104a may be have shorter width than the intermediate layer 104 and be disposed toward an outer portion of the stacked PCB carrier 100. Together the intermediate conductive layer 104 and the additional conductive layer 104a may provide a thicker conductive layer distal from the pocket 120 to add medial support to the stacked PCB carrier 100. The stacked PCB carrier 100 may include a second insulation layer 105 stacked on top of the intermediate conductive layer 104 and the additional conductive layer 104a. The second insulation layer 105 may have a width W4 that is smaller than the width W3 of underlying layers. A second portion of the insulation layer may be formed on an opposing side of the pocket 120. The top conductive layer 106 may include an inside portion that is adjacent the pocket 120. The top conductive layer 106 may have the same width W4 as the second insulation layer 105. The smaller width W4 of the second insulation layer 105 in combination with the width W4 of the top conductive layer 106 surround a width W2 of the pocket 120. Solder may be added to the pocket 120 to ensure electrical connection between the top conductive layer 106 and the discrete component 110. The lower conductive layer 102, intermediate conductive layer 104, additional conductive layer 104a, and the top conductive layer 106 may be connected by a conductive via 112. The conductive via 112 may provide electrical connection between the conductive layers, and provide electrical connection to the PCB (illustrated in FIG. 3). The conductive via 112 may also provide structural integrity to the stacked PCB carrier 100.

As noted above, the stacked PCB carrier 100 may include the pocket 120. The pocket 120 of a stacked PCB carrier 100 may be fashioned to receive a discrete component of a smaller size that a perimeter or footprint of the stacked PCB carrier 100. The footprint or perimeter 150 may be along the outer edges of the stacked PCB carrier 100, designated by the bracket. The footprint 150 of the stacked PCB carrier 100 may correspond to a to a placement space on a PCB of a large size component.

Design implementations of the stacked PCB carrier 100 may be based on a size of an available area versus a size of the discrete component that is available. For example, if an available area on a PCB was designed for an 0805 large device, and the replacement discrete component is an 0201 small component, the stacked PCB carrier 100 may be designed to be a size that is typically used for the large 0805 device. That is, a footprint or perimeter 150 of the stacked PCB carrier 100 may substantially match and be a same size as the footprint or perimeter of the large 0805 device that was originally designed to be in the available area. While an external perimeter of the stacked PCB carrier 100 may substantially take up the available area, the pocket 120 in the middle of the stacked PCB carrier 100 may be designed to accommodate a component size that is typically used for an 0201 component. The 0805 and 0201 size components are cited, of course, by way of example. The stacked PCB carrier 100 may work with any combination of different discrete sizes in different size pockets 120 to replace components of various larger sizes designed to fit into different size areas.

The pocket 120 may extend from one side of the air gap 108 to another side of the air gap 108 in a first direction. The pocket 120 may extend from the top conductive layer 106 to the intermediate conductive layer 104 in a second direction substantially orthogonal to the first direction. A depth of the pocket 120 in the second direction may be substantially half of a height of the stacked PCB 100. The height of the stacked PCB carrier 100 may be the height from the lower conductive layer 102 to the top conductive layer 106. When a discrete component 110 is mounted in the stacked PCB carrier 100, a portion of the discrete component 110 may be encompassed in the pocket 120 and another portion of the discrete component 110 may be exposed out of the pocket 120, above a top surface of the top conductive layer 106.

Figure 2:
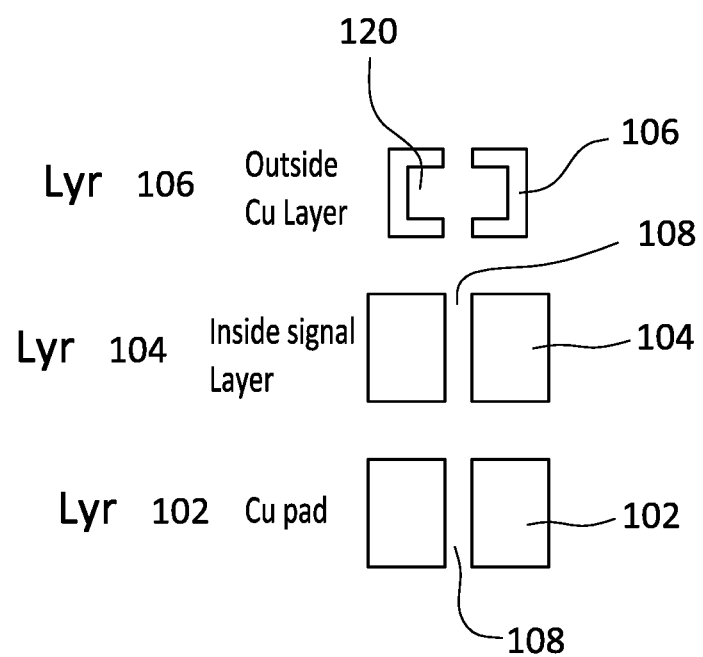
FIG. 2 illustrates different conductive layers in accordance with FIG. 1.

FIG. 2 illustrates different conductive layers in accordance with FIG. 1. As illustrated in FIG. 2, the lower conductive layer 102 and the intermediate conductive layer 104 include wide conductive layers separated by the air gap 108. The wide conductive layers of the lower conductive layer 102 may facilitate extended electrical connection with a PCB (not illustrated). The wide intermediate conductive layer 104 may include the conductive landing portion 107 that receives a discrete component 110 thereon. The top conductive layer 106 may a narrower width than the portions of the intermediate conductive layer 104 and lower conductive layer 102. This narrower width of the top conductive layer 106 is designed to receive a discrete component 110 within the pocket 120 of the stacked PCB carrier 100.

Figure 3:
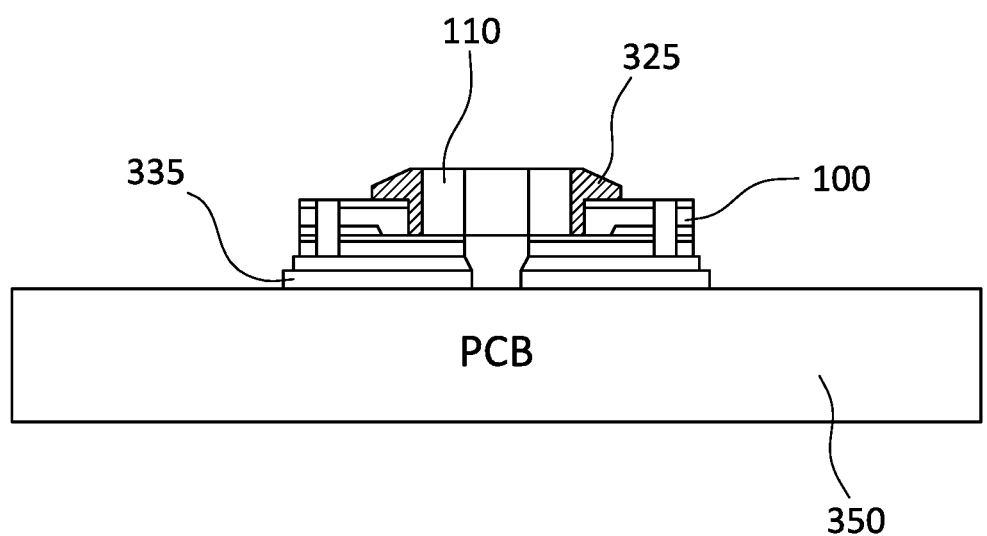
FIG. 3 illustrates a stacked PCB carrier on a PCB in accordance with embodiments described herein.

FIG. 3 illustrates a stacked PCB carrier 100 on a PCB 350 in accordance with embodiments described herein. As discussed herein, the stacked PCB carrier 100 that includes a discrete component 110 may be mounted to a printed circuit board (PCB) 350. The stacked PCB carrier 100 may be electrically connected to the PCB 350 using a solder layer 335. A solder section 325 may be used to provide side electrical connection between internal conductive layers of the stacked PCB carrier 100 and the discrete component 110. In this manner, a discrete component 110 of small size may be used on a footprint of the stacked PCB carrier 100 that has a larger size than the discrete component 110, yet still fit within a specified design of the PCB 350.

Embodiments described herein may be used with design hardware products in product areas such as, IP Router, Optic, Wireless or Fixed Network products, and others. A target application may apply the stacked PCB carrier 100 to many electronic products including as automotive, consumer products, etc.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

The invention claimed is:

1. A discrete component carrier, comprising:
a multi-layer structure having a height including a plurality of conductive layers and a plurality of insulating layers respectively spaced between the plurality of conductive layers, the multi-layer structure having a footprint corresponding to a large size component of a printed circuit board (PCB); and
a pocket having a depth formed in the multi-layer structure, the pocket configured to receive a discrete component of a size smaller than the large size component, wherein the pocket has a depth that is substantially half of the height of the multi-layer structure, and wherein the height of the multi-layer structure is lower than a height of the discrete component.

2. The discrete component carrier of claim 1, wherein the multi-layer structure includes a lower conductive layer, an intermediate conductive layer, and a top conductive layer.

3. The discrete component carrier of claim 2, wherein the intermediate conductive layer includes a thin portion proximate the pocket and a thick portion distal from the pocket.

4. The discrete component carrier of claim 2, wherein the intermediate layer includes a landing portion configured to receive and make electrical connection with the discrete component.

5. The discrete component carrier of claim 1, comprising a plurality of insulation layers of different widths to form the pocket.

6. The discrete component carrier of claim 2, wherein the lower conductive layer includes two portions with an air gap therebetween.

7. The discrete component carrier of claim 2, wherein the intermediate conductive layer includes two portions with an air gap therebetween.

8. The discrete component carrier of claim 2, comprising solder disposed within the pocket adjacent the top conductive layer to form an electrical connection with the discrete component.

9. A discrete component carrier, comprising:
a multi-layer structure including a plurality of conductive layers and a plurality of insulating layers respectively spaced between the plurality of conductive layers, the multi-layer structure having a footprint corresponding to a large size component of a printed circuit board (PCB); and
a pocket formed in the multi-layer structure, the pocket configured to receive a discrete component of a size smaller than the large size component,
wherein the multi-layer structure includes a lower conductive layer, an intermediate conductive layer, and a top conductive layer, and wherein the intermediate conductive layer includes a thin portion proximate the pocket and a thick portion distal from the pocket.

10. The discrete component carrier of claim 9, wherein the intermediate layer includes a landing portion configured to receive and make electrical connection with the discrete component.

11. The discrete component carrier of claim 9, comprising a plurality of insulation layers of different widths to form the pocket.

12. The discrete component carrier of claim 9, wherein the lower conductive layer includes two portions with an air gap therebetween.

13. The discrete component carrier of claim 9, wherein the intermediate conductive layer includes two portions with an air gap therebetween.

14. The discrete component carrier of claim 9, comprising solder disposed within the pocket adjacent the top conductive layer to form an electrical connection with the discrete component.

15. The discrete component of claim 9, wherein a height of the multi-layer structure is lower than a height of the discrete component.

\* \* \* \* \*